United States Patent
Subramanian et al.

(10) Patent No.: US 7,368,225 B1
(45) Date of Patent: *May 6, 2008

(54) TWO MASK PHOTORESIST EXPOSURE PATTERN FOR DENSE AND ISOLATED REGIONS

(75) Inventors: Ramkumar Subramanian, Sunnyvale, CA (US); Scott A. Bell, San Jose, CA (US); Todd P. Lukanc, San Jose, CA (US); Marina V. Plat, San Jose, CA (US); Uzodinma Okoroanyanwu, Sunnyvale, CA (US); Hung-Eil Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 639 days.

This patent is subject to a terminal disclaimer.

(21) Appl. No.: 10/925,123

(22) Filed: Aug. 24, 2004

Related U.S. Application Data

(62) Division of application No. 09/887,035, filed on Jun. 25, 2001, now Pat. No. 6,803,178.

(51) Int. Cl.
*G03F 7/00* (2006.01)
(52) U.S. Cl. .................. 430/311; 430/394; 430/312
(58) Field of Classification Search .............. 430/313, 430/311, 314, 394, 5
See application file for complete search history.

(56) References Cited

U.S. PATENT DOCUMENTS 5,563,012 A    10/1996  Neisser
6,218,089 B1   4/2001   Pierrat
6,309,800 B1   10/2001  Okamoto
6,337,162 B1   1/2002   Irie
6,498,105 B1   12/2002  Kim
6,541,166 B2   4/2003   Mansfield et al.
6,541,167 B2   4/2003   Petersen et al.
6,780,574 B2   8/2004   Kawashima
6,803,178 B1 * 10/2004  Subramanian et al. ...... 430/394
2001/0055733 A1  12/2001  Irie et al.
2002/0106587 A1  8/2002   Lukanc et al.

OTHER PUBLICATIONS

J.N. Helbert and T. Daou, "Resist Technology—Design, Processing and Applications", in Handbook of VLSI Microlithography, ed. Helbert, Noyes Publication, NY-2001, pp. 74-188.

* cited by examiner

*Primary Examiner*—Mark F. Huff
*Assistant Examiner*—Caleen O. Sullivan
(74) *Attorney, Agent, or Firm*—Foley & Lardner LLP

(57) ABSTRACT

There is provided a method of making plurality of features in a first layer. A photoresist layer is formed over the first layer. Dense regions in the photoresist layer are exposed through a first mask under a first set of illumination conditions. Isolated regions in the photoresist layer are exposed through a second mask different from the first mask under a second set of illumination conditions different from the first set of illumination conditions. The exposed photoresist layer is patterned and then the first layer is patterned using the patterned photoresist layer as a mask.

20 Claims, 5 Drawing Sheets

TWO MASK PHOTORESIST EXPOSURE PATTERN FOR DENSE AND ISOLATED REGIONS

CROSS-REFERENCE TO RELATED PATENT APPLICATIONS

This application is a Division of U.S. application Ser. No. 09/887,035, filed Jun. 25, 2001, incorporated herein by reference in its entirety.

BACKGROUND OF THE INVENTION

The invention relates generally to semiconductor device manufacturing and, more particularly, to photolithographically forming plural features using different illumination conditions.

Semiconductor devices having smaller and smaller features are approaching a limit in which such features may be formed by conventional photolithography methods. For example, conventional photolithography methods produce vias in an insulating layer, as illustrated FIGS. 1A and 1B. A positive photoresist layer 3 is formed over an insulating layer 1 in which it is desired to form a first and second via. A plurality of regions 5A, 5B, 5C and 7 in the photoresist layer 3 are simultaneously exposed to actinic light 8 through openings 11A, 11B, 11C and 13 in a single mask or reticle 9, as illustrated in FIG. 1A. The terms mask and reticle are used interchangeably, with the term reticle often applied to a mask used in step and repeat exposure systems. The exposed regions 5A, 5B, 5C and 7 are then developed and removed, while unexposed regions 6 remain as shown in FIG. 1B. A gas or liquid etching medium is then supplied through the openings 5A, 5B, 5C and 7 in the photoresist layer 3 to etch vias 15A, 15B, 15C and 17 in layer 1, as illustrated in FIG. 1C.

However, as the density of the vias has increased and the size of the vias has decreased, diffraction effects often result in patterning errors. These errors result in via size or location that deviate from the desired size or location.

Furthermore, only certain values of exposure dose and defocus are allowed to form an exposed region in the photoresist layer within the allowed design parameters. A set of allowed exposure dose and defocus values that may be used in exposing a particular region is referred to as a process window.

It has been suggested that the process window 101 for exposing dense regions in a photoresist layer differs from the process window 103 for exposing isolated regions in the photoresist layer, as shown in FIG. 2A. See A. R. Newreueher and C. A. Mack, SPIE Short Course Note SC102, "Optical Lithography Modeling", Feb. 27, 2000. For large features to be exposed, there is a large overlap 105 between the windows 101 and 103, as shown in FIG. 2A. Therefore, in order to expose both dense and isolated regions, the corresponding value of exposure dose and defocus must be located in the overlap region 105 between the process windows 101 and 103. For large features to be exposed, it is relatively easy to select appropriate values of exposure dose and defocus that fall into the large overlap region 105, as shown in FIG. 2A.

However, the overlap region 205 of process windows for exposing dense 201 and isolated 203 regions in a photoresist layer is relatively small for exposed features having a small size, as shown in FIG. 2B. Region 207 of process window 201 and region 209 of process window 203 outside the overlap region 205 cannot be used when exposing both dense and isolated regions. Therefore, it is difficult to select the exposure conditions which are optimum for both small dense and isolated regions because the process window overlap 205 for exposing such regions is also small.

BRIEF SUMMARY OF THE INVENTION

According to one aspect of the present invention, there is provided a method of making plurality of features in a first layer, comprising forming a photoresist layer over the first layer, exposing dense regions in the photoresist layer through a first mask under a first set of illumination conditions, exposing at least one isolated region in the photoresist layer through a second mask different from the first mask under a second set of illumination conditions different from the first set of illumination conditions, patterning the exposed photoresist layer, and patterning the first layer using the patterned photoresist layer as a mask.

According to another aspect of the present invention, there is provided a method of making a semiconductor device comprising forming a first layer of the semiconductor device, forming a photoresist layer over the first layer, exposing dense regions in the photoresist layer through a first mask using a first focus, exposing isolated regions in the photoresist layer through a second mask different from the first mask using a second focus different from the first focus, removing the exposed dense and isolated regions in the photoresist layer to form a patterned photoresist layer, and etching the first layer using the patterned photoresist layer as a mask.

According to another aspect of the present invention, there is provided a method of making a semiconductor device, comprising forming at least one semiconductor device on a substrate, forming a first insulating layer over the semiconductor device, forming a photoresist layer over the first insulating layer, and exposing dense regions in the photoresist layer through a first mask using a first focus. The method further comprises exposing isolated regions in the photoresist layer through a second mask different from the first mask using a second focus different from the first focus, removing the exposed dense and isolated regions in the photoresist layer to form dense and isolated openings in the photoresist layer, providing an etching gas or an etching liquid to the first insulating layer through the dense and the isolated openings in the photoresist layer to form a plurality of dense and isolated openings in the first insulating layer, and forming a conductive material in the dense and the isolated openings.

DETAILED DESCRIPTION OF THE INVENTION

Figure 1A:
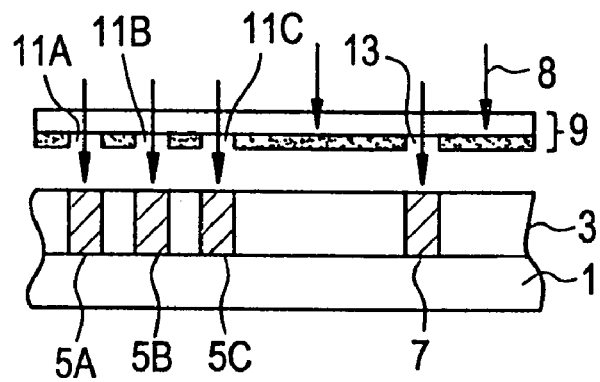
FIGS. 1A, 1B and 1C are side cross sectional views of a prior art method of making vias.
Figure 1B:
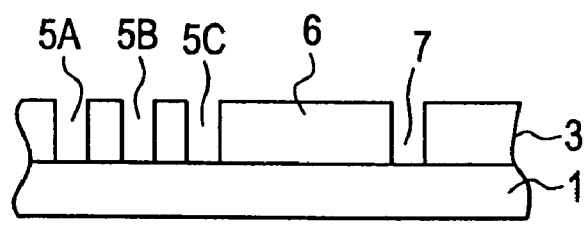
Figure 1C:
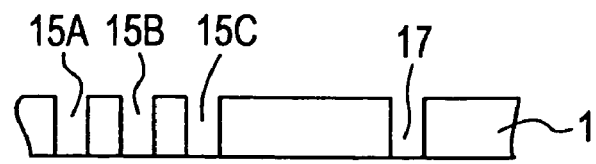

The present inventors have determined that patterning errors may be decreased if the dense photoresist regions and the isolated photoresist regions are exposed through separate masks or reticles under different illumination conditions (i.e., different optical settings). By using separate masks to expose dense and isolated photoresist regions, the illumination conditions may be optimized for the dense and the isolated photoresist regions. Furthermore, in contrast to the prior art method of exposing dense and isolated regions through the same mask, by using separate masks to expose dense and isolated regions, the available process windows for the exposure of the dense and isolated regions are not restricted to the overlap region between the dense and the isolated region process windows.

As used herein, dense exposed regions are spaced closer together than isolated exposed regions (i.e., the dense regions have a smaller pitch than the isolated regions). A different set optimum of illumination conditions provides an optimum exposure for the dense regions and for the isolated regions. In a preferred aspect of the present invention, the term "dense regions" includes, but is not limited to, exposed regions that are within 500 nm, preferably within 300 nm of another exposed region in the photoresist layer. The term "isolated", includes but is not limited to, exposed regions that are farther then 500 nm, preferably farther than 1 micron from the nearest another exposed region in the photoresist layer. However, the exposed regions are not necessarily classified into "dense" and "isolated". For example, exposed regions that are between 301 and 999 nm away from the nearest other exposed region may be considered to be "semi-dense," and may be exposed through a third mask using a third set of illumination conditions. Furthermore, there may be several sets of semi-dense regions, depending on the application, which may be exposed through separate masks under different sets of illumination conditions than other sets of regions.

As used herein, illumination conditions include any optical setting for the exposure system (i.e., the illumination system) used to expose the photoresist layer. These conditions include any one or more of focus, partial coherence, numerical aperture width, illumination type and any other relevant setting of the exposure system which affect the size and location of the exposed regions. Focus refers to the distance between the photolithographic mask (i.e. mask or reticle) and the lens of the exposure system. Partial coherence ($\sigma$) is a function of the intensity of radiation that reaches the mask (i.e. mask or reticle). Illumination type includes conventional illumination or annular illumination that is used to expose the photoresist layer. The specific illumination conditions are dependent on the particular type of exposure system, width of the mask openings, the desired pattern to be exposed in the photoresist pattern and other factors. The illumination conditions may be optimized by using a simulation program that is used with the exposure system.

Figure 2A:
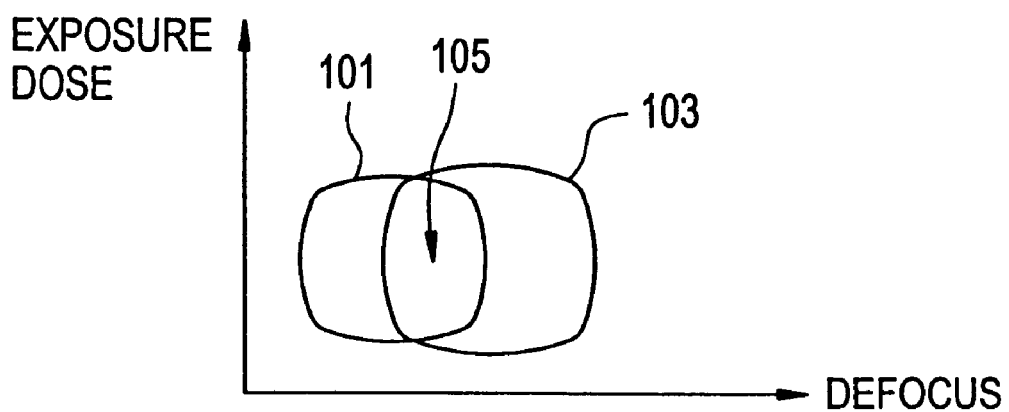
FIGS. 2A and 2B are illustrations of process windows on plots of exposure dose versus defocus values.
Figure 2B:
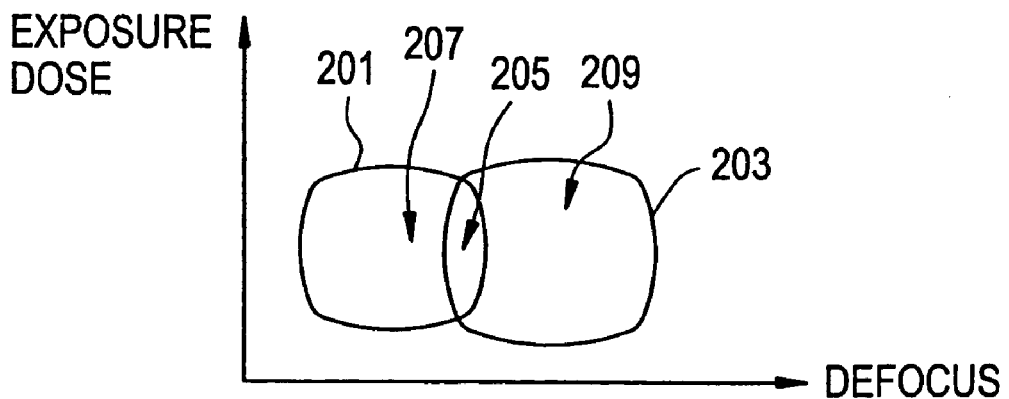

The values of exposure dose and defocus used to expose the dense and/or the isolated regions are not restricted to values in the process window overlap. With reference to FIG. 2B, the values of exposure dose and defocus used to expose the dense regions through a first mask may be located in region 207 of the dense region process window 201 which is outside the overlap region 205. The values of exposure dose and defocus used to expose the isolated regions through a second mask may be different that those used to expose the dense regions. The values of exposure dose and defocus used to expose the isolated regions may be located in region 209 of the isolated region process window 203 which is outside the overlap region 205. Thus, with reference to FIG. 2B, if desired, the values of exposure dose and defocus used to expose the dense regions and/or the isolated regions may be located in region 207 and/or 209 of a respective process window 201, 203 outside the overlap region 205 between the respective process windows 201, 203. Of course, the values of the exposure dose and defocus for dense and/or isolated regions may be located in the overlap region 205, if desired. Therefore, by using separate masks to expose dense and isolated regions, the process windows are expanded.

Figure 3:
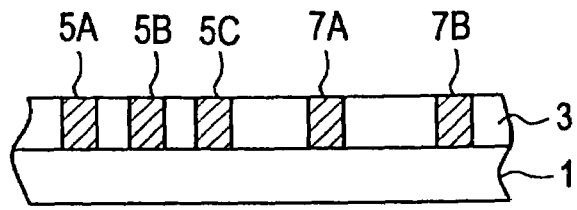
FIG. 3 is a side cross sectional view of a photoresist layer containing dense and isolated exposed regions.

FIG. 3 illustrates an example of dense and isolated exposed regions. In FIG. 3, a photoresist layer 3 is formed over a first layer 1, such as a semiconductor, insulating or conductive layer. The photoresist layer 3, may be a positive or a negative photoresist layer, as will be explained in more detail below. A plurality of exposed regions 5A, 5B, 5C, 7A and 7B are present in the photoresist layer 3. Dense regions 5A, 5B and 5C have a smaller pitch (i.e., distance to the nearest other exposed region) than isolated regions 7A and 7B. There may be two or more dense regions and one or more isolated regions.

Figure 4A:
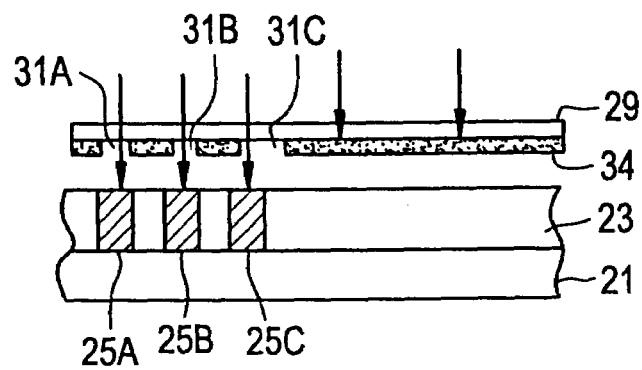
FIGS. 4A, 4B, 4C and 4D are side cross sectional views of a photolithography method according to a first preferred embodiment of the present invention.

FIGS. 4A-4D illustrate a photolithography method using a positive photoresist and two masks to form vias according to a first preferred embodiment of the present invention. A positive photoresist layer 23 is formed over the first layer 21. The photoresist layer 23 is then exposed to radiation, such as actinic light or other suitable UV radiation, through openings 31A, 31B and 31C in a first mask or reticle 29 to form a set of dense exposed regions 25A, 25B, 25C in the photoresist layer 23, as illustrated in FIG. 4A. The dense exposed regions are exposed under a first set of illumination conditions, which include a first focus, partial coherence, numerical aperture width and/or illumination type. The selected first set of illumination conditions is optimized to expose dense regions in the photoresist layer. The exposed regions 25A, 25B, 25C of the photoresist layer 23 are rendered soluble to developer. Other regions of the photoresist layer 23 are shielded by the opaque layer 34 of the mask 29 and are not exposed.

Figure 4B:
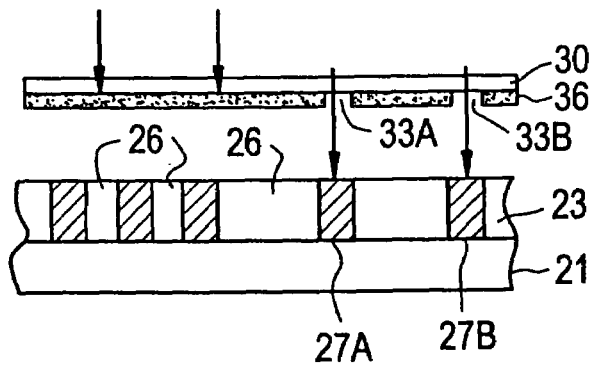

The photoresist layer 23 is then exposed to radiation through openings 33A and 33B in a second mask or reticle 30, different from the first mask 29, to form isolated exposed regions 27A and 27B in the photoresist layer 23, as illustrated in FIG. 4B. The isolated exposed regions are exposed under a second set of illumination conditions, which is different from the first set of illumination conditions. The selected second set of illumination conditions is optimized to expose isolated regions in the photoresist layer. Preferably the first focus used to expose the dense exposed regions differs from the second focus used to expose the isolated regions. For example, the first focus may differ from the second focus by 1 to 30%, preferably by 15-25%. However, the second partial coherence, numerical aperture width and/or illumination type may be different from the first partial coherence, numerical aperture width and/or illumination type instead of or in addition to the focus difference. The dense regions 25A, 25B and 25C are not exposed because they are shielded by an opaque region 36 of the second mask 30. The exposed photoresist regions 25A, 25B, 25C, 27A, 27B are separated by non-exposed regions 26, which remain insoluble to the developer.

Figure 4C:
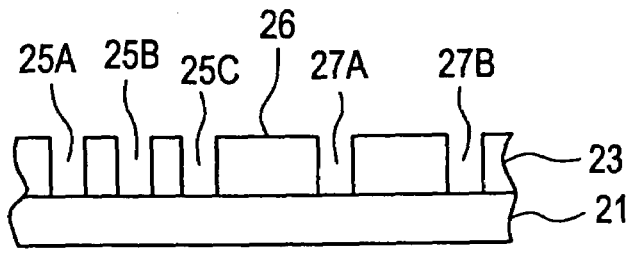

After exposing the dense and isolated regions, the photoresist layer 23 is developed (i.e., exposed to a developer fluid) to remove the exposed, soluble photoresist from regions 25A, 25B, 25C, 27A, 27B to provide openings to layer 21, as shown in FIG. 4C. Unexposed photoresist regions 26 are not removed during development, and are used as a mask for subsequent etching of layer 21. It should be noted that the order of steps may be reversed and the isolated regions may be exposed before rather than after the dense regions.

Figure 4D:
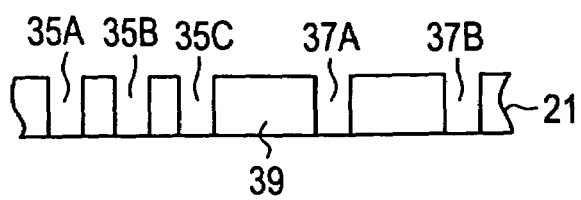

After the openings are provided in the photoresist layer 23, the dense openings or vias 35A, 35B, 35C and isolated openings or vias 37A and 37B are formed in layer 21 by providing an etching gas or an etching liquid to the first layer through the openings 25A, 25B, 25C, 27A, 27B in the photoresist layer 23. Thus, vias 35A, 35B, 35C, 37A and 37B separated by intervia regions 39 are formed in layer 21, as illustrated in FIG. 4D. After completion of the etching, the remaining photoresist layer 23 is removed by conventional removal techniques, such as ashing.

Figure 5A:
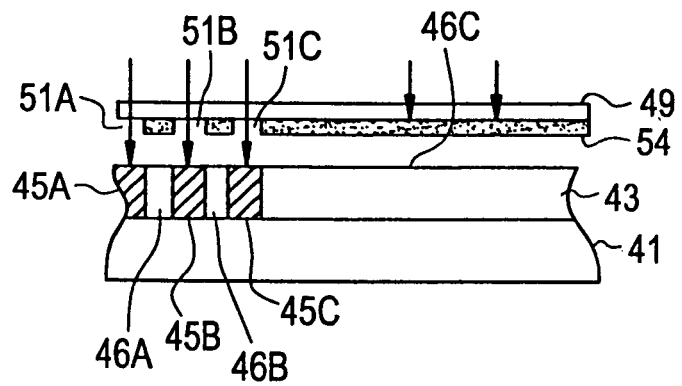
FIGS. 5A, 5B, 5C and 5D are side cross sectional views of a photolithography method according to a second preferred embodiment of the present invention.
Figure 5B:
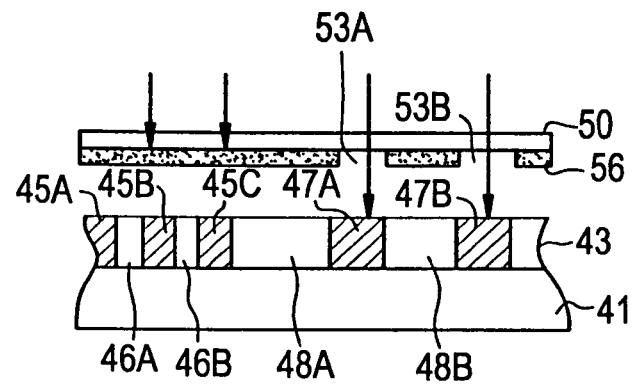
Figure 5C:
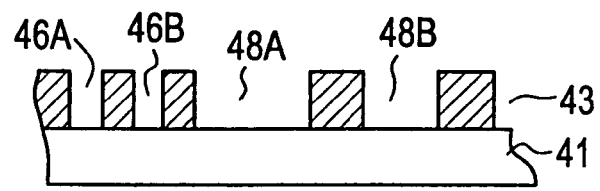

FIGS. 5A-5C illustrate a photolithography method using a negative photoresist according to a second preferred embodiment of the present invention. A negative photoresist layer 43 is formed over the first layer 41. The photoresist layer 43 is uncrosslinked and is thus developer soluble. The photoresist layer 43 is then exposed to radiation, such as actinic light or other suitable UV radiation, through openings 51A, 51B and 51C in a first mask or reticle 49 to form dense exposed regions 45A, 45B, 45C in the photoresist layer 43, as illustrated in FIG. 5A. The dense exposed regions are exposed under a first set of illumination conditions. The selected first set of illumination conditions is optimized to expose dense regions in the photoresist layer. The exposure to radiation crosslinks the photoresist in regions 45A, 45B, 45C, rendering these regions insoluble to developer. Regions 46A, 46B and 46C are not exposed because they are shielded by opaque layer 54 of the first mask 49.

The photoresist layer 43 is then exposed to radiation through openings 53A, 53B in a second mask or reticle 50, different from the first mask 49, to form isolated exposed regions 47A, 47B in the photoresist layer 43, as illustrated in FIG. 5B. The isolated exposed regions are exposed under a second set of illumination conditions, which is different from the first set of illumination conditions. The selected second set of illumination conditions is optimized to expose isolated regions in the photoresist layer. Preferably the first focus used to expose the dense exposed regions differs from the second focus used to expose the isolated regions. For example, the first focus may differ from the focus by 1 to 30%, preferably by 15-25%. However, the second partial coherence, numerical aperture width and/or illumination type may be different from the first second partial coherence, numerical aperture width and/or illumination type instead of or in addition to the focus difference. The exposure to radiation crosslinks the photoresist in regions 47A, 47B, rendering these regions insoluble to developer. The exposed photoresist regions 45A, 45B, 45C, 47A, 47B are separated by the non-exposed regions 46A, 46B, 48A, and 48B which are shielded by the opaque layer 56 of the second mask 50.

After exposing the dense and isolated regions 45A, 45B, 45C, 47A, 47B, the photoresist layer 43 is developed to remove the uncrosslinked photoresist from the unexposed regions 46A, 46B, 48A, and 48B to provide openings to layer 41, as shown in FIG. 5C. Photoresist regions 45A, 45B, 45C, 47A, 47B are not removed during development and are used as a mask for subsequent etching of layer 41. If desired, the order of steps of FIGS. 5A and 5B may be reversed, and regions 47A, 47B may be exposed through the second mask 50 before regions 45A, 45B, 45C are exposed through the first mask 49.

Figure 5D:
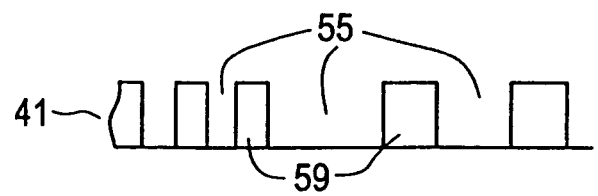

After the openings are provided in the photoresist layer 43, the openings or vias 55 are formed in layer 41 by providing an etching gas or an etching liquid to the first layer through the openings in the photoresist layer 43. Thus, vias 55 separated by intervia regions 59 are formed in layer 41, as illustrated in FIG. 5D.

Figure 6:
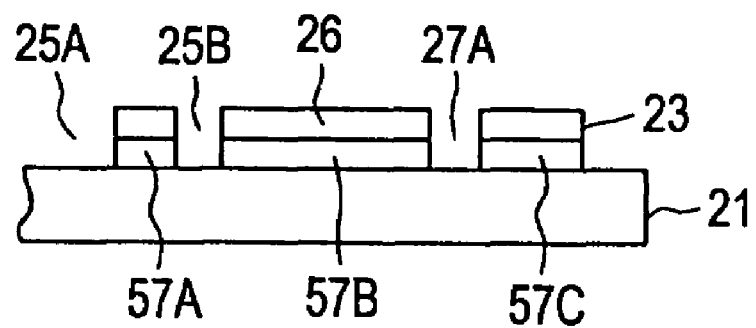
FIG. 6 is a side cross sectional view of features made by a photolithography method according to an alternative preferred embodiment of the present invention.

While FIGS. 4A-4D and 5A-5D illustrate only five and four vias respectively, for ease of explanation, it should be understood that a semiconductor device may contain any number of a plurality of vias. Furthermore, the photolithography method of the preferred embodiments is not limited to forming vias in an insulating layer. The photoresist layer containing dense and isolated exposed regions, after being developed, may be used to as a mask to pattern an underlying semiconductor or a conductive layer. For example, an etching gas or an etching liquid may be provided to the conductive or semiconductor layer through openings in the patterned photoresist layer to form a plurality of features in this layer. Thus, conductive interconnects or electrodes, such as gate electrodes, or semiconductor mesas, such as emitter regions of a bipolar transistor, may be patterned according to the preferred embodiments of the present invention. FIG. 6 illustrates an exemplary, in-process semiconductor device, where dense metal electrodes 57A, 57B, 57C are patterned after exposed dense 25A, 25B and isolated 27A regions of a positive photoresist layer 23 are developed and removed.

Figure 7:
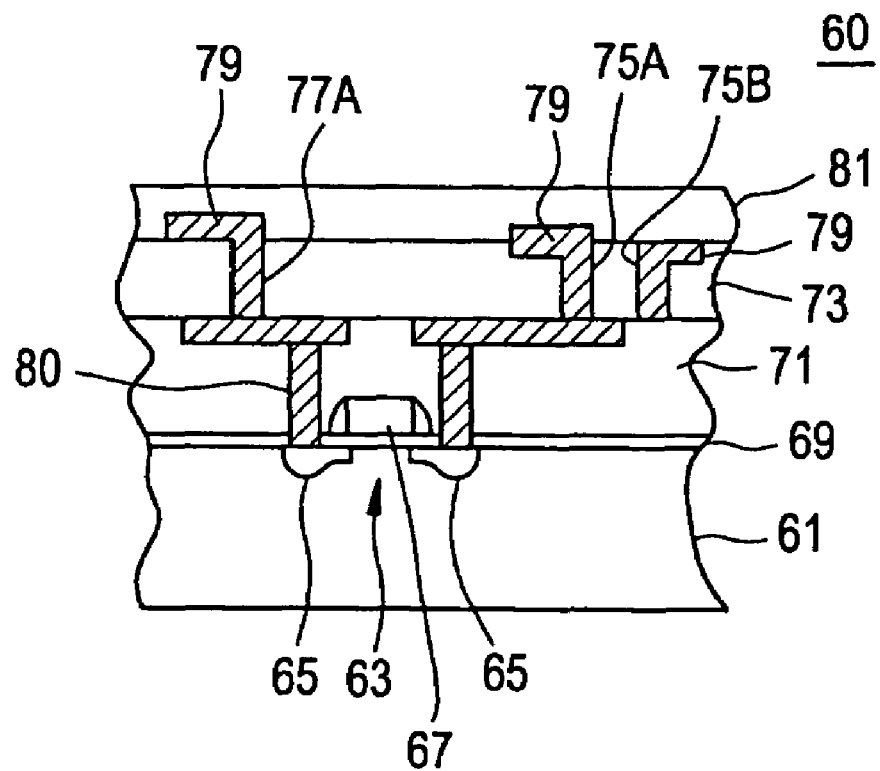
FIG. 7 is a partial side cross sectional view of a completed semiconductor device made by the method of the preferred embodiments of the present invention.

FIG. 7 illustrates a completed semiconductor device 60 containing the vias made by the methods of the first or second preferred embodiment. The semiconductor device 60 contains a substrate 61, which may be a semiconductor (such as silicon or gallium arsenide, etc.), a glass or a plastic material. One or more active elements 63 are formed on the substrate 61. The active element may comprise at least one of a MOSFET, a MESFET, a bipolar transistor, a capacitor, a resistor or any other desired device. For example, FIG. 7 illustrates a MOSFET 63.

The MOSFET 63 contains doped source and drain regions 65 in the substrate 61, a gate electrode 67 with sidewall spacers and a gate dielectric 69 between the gate electrode and the channel region in the substrate 61. At least one insulating layer overlies the active element 63. For example, the at least one insulating layer includes a first level insulating layer 71 and a first intermetal dielectric 73, as illustrated in FIG. 7. It should be understood that there may be other plural intermetal dielectric layers above layer 73 that contain vias. The insulating layers 71, 73 may comprise any dielectric layer, such as at least one of silicon oxide, silicon nitride, silicon oxynitride, fluorinated silicon oxide, aluminum oxide, tantalum oxide, BPSG, PSG, BSG or spin on glass. In should be noted that the insulating layers 71, 73 may comprise plural sublayers of different dielectric materials, if desired.

The first level intermetal dielectric layer 73 contains dense vias 75A, 75B and isolated via 77A. The vias are formed using two masks, as illustrated in FIGS. 4A-4D or 5A-5D. For example, vias 75A, 75B, may be formed using mask 29 and via 77A, may be formed using mask 30. Conductive first level interconnect metallization layers 79 are formed in the vias. The metallization layers 79 may extend to the electrodes 80 of the active device 63, such that the metallization layers 79 contact the electrodes 80. The metallization 79 material may be selected from at least one of polysilicon, aluminum, copper, tungsten, titanium, titanium nitride or metal silicide. A second level intermetal dielectric layer 81 overlies metallization layers 79. If desired, the metallization 79 may also be formed using two masks, as described in reference to FIG. 6.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments, but should be defined only in accordance with the following claims and their equivalents.

The invention claimed is:

1. A method of making a semiconductor device including a first layer and a photoresist layer, the photoresist layer being above the first layer, the method comprising:
exposing dense regions in the photoresist layer through a first mask using a first focus;
exposing isolated regions in the photoresist layer through a second mask different from the first mask using a second focus different from the first focus;
removing the exposed dense and isolated regions in the photoresist layer to form a patterned photoresist layer; and
etching the first layer using the patterned photoresist layer as a mask.

2. The method of claim 1, wherein:
the first layer comprises an insulating layer; and
the step of etching the first layer comprises providing an etching gas or an etching liquid to the first layer through openings in the patterned photoresist layer to form a plurality of dense and isolated openings in the first layer.

3. The method of claim 1, wherein:
the first layer comprises a semiconductor or a conductive layer; and
the step of etching the first layer comprises providing an etching gas or an etching liquid to the first layer through openings in the patterned photoresist layer to form a plurality of features in the first layer.

4. The method of claim 1, further comprising:
selecting the first focus which is optimized to expose dense regions in the photoresist layer; and
selecting the second focus which is optimized to expose isolated regions in the photoresist layer.

5. The method of claim 1, wherein the dense exposed regions are separated by 500 nm or less from a nearest other exposed region and the isolated exposed regions are separated by more than 500 nm from a nearest other exposed region.

6. A method of making an integrated circuit, the integrated circuit including a first insulating layer over a semiconductor device, and a photoresist layer above the first insulating layer, the method comprising:
exposing dense regions in the photoresist layer through a first mask using a first optical parameter;
exposing isolated regions in the photoresist layer through a second mask different from the first mask using a second optical parameter different from the first optical parameter;
removing the exposed dense and isolated regions in the photoresist layer to form dense and isolated openings in the photoresist layer;
providing an etching substance to the first insulating layer through the dense and the isolated openings in the photoresist layer to form a plurality of dense and isolated openings in the first insulating layer; and
forming a conductive material in the dense and the isolated openings.

7. The method of claim 6, wherein the photoresist layer includes a positive photoresist material.

8. The method of claim 6, wherein the first and second optical parameters are related to focus.

9. The method of claim 6, wherein the dense regions are within 300 nm from each other.

10. The method of claim 6 wherein the dense regions are within 500 nm from each other.

11. The method of claim 6, wherein the first layer comprises an insulating layer.

12. The method of claim 11, wherein the etching substance is a gas.

13. The method of claim 6, wherein the first layer comprises a semiconductor layer.

14. The method of claim 6, wherein the first optical parameter and the second optical parameter differ by at least one of focus, partial coherence, numerical aperture width, and illumination type.

15. The method of claim 6, wherein the first optical parameter is optimized to expose dense regions in the photoresist layer, and the second optical parameter is optimized to expose isolated regions in the photoresist layer.

16. The method of claim 6, further comprising exposing semi-dense regions separated by 301 to 999 nm in the photoresist layer through a third mask different from the first and the second masks under a third optical parameter different from the first and second optical parameters.

17. A method of making an integrated circuit including a first layer, the method comprising:
providing a photoresist layer, the photoresist layer being above the first layer;
exposing dense regions in the photoresist layer through a first mask using lithographic equipment set to a first optical parameter;
exposing isolated regions in the photoresist layer through a second mask different from the first mask using the lithographic equipment set to a second optical parameter different from the first optical parameter;
removing the exposed dense and isolated regions in the photoresist layer to form a patterned photoresist layer; and
etching the first layer using the patterned photoresist layer as a mask.

18. The method of claim 17, wherein:
the first layer comprises an insulating layer; and
the step of etching the first layer comprises providing an etching gas or an etching liquid to the first layer through openings in the patterned photoresist layer to form a plurality of dense and isolated openings in the first layer.

19. The method of claim 17, further comprising:
selecting a first focus as the first optical parameter optimized to expose dense regions in the photoresist layer; and selecting a second focus as the second optical parameter optimized to expose isolated regions in the photoresist layer.

20. The method of claim 17, wherein the dense exposed regions are separated by 500 nm or less from a nearest other exposed region and the isolated exposed regions are separated by more than 500 nm from a nearest other exposed region.

* * * * *